United States Patent [19]
Ohori

[11] Patent Number: 5,326,995
[45] Date of Patent: Jul. 5, 1994

[54] SEMICONDUCTOR DEVICE HAVING A HETEROJUNCTION INTERFACE FOR TRANSPORTING CARRIERS WITH IMPROVED CARRIER MOBILITY

[75] Inventor: Tatsuya Ohori, Kawasaki, Japan

[73] Assignee: Fujitsu Limited, Kawasaki, Japan

[21] Appl. No.: 907,405

[22] Filed: Jul. 1, 1992

[30] Foreign Application Priority Data

Jul. 3, 1991 [JP] Japan .................. 3-162571

[51] Int. Cl.$^5$ ............... H01L 29/80; H01L 29/161
[52] U.S. Cl. ............... 257/194; 257/12; 257/14; 257/615; 257/613
[58] Field of Search ............... 257/194, 12, 14, 284, 257/613, 615

[56] References Cited

U.S. PATENT DOCUMENTS

| | | | |
|---|---|---|---|
| 4,745,452 | 5/1988 | Sollner | 357/30 |
| 5,164,800 | 11/1992 | Nakajima | 257/194 |

FOREIGN PATENT DOCUMENTS 0156773  7/1986  Japan ............... 257/194

OTHER PUBLICATIONS

Nakata et al., "Extremely High 2DEG Concentration in Selectively Doped in$_{0.53}$Ga$_{0.47}$As/N-In$_{0.52}$Al$_{0.48}$As Heterostructures Grown by MBE," Japanese Journal of Applied Physics, Part 2: Letters, vol. 26, No. 1, Jan. 1987, Tokyo, Japan, pp. 59–61.
Patent Abstracts of Japan, vol. 13, No. 468 (E-834) Oct. 23, 1989 & JP-A-1 183859 (Sumitomo Electric Industries) Jul. 21, 1989.
Aina et al., "AlInAs/InP MODFET Structures Grown by OMVPE," Second International Conference: Indium Phosphide and Related Materials, Apr. 23–25, 1990, Denver, Colo., IEEE Catalog #90CH2859-7, pp. 274–281.
Ng et al., "Submicron Double Heterojunction Strained InAlAs/InGaAs HEMT's: An Experimental Study of DC and Microwave Properties," Second International Conference: Indium Phosphide and Related Materials, Apr. 23–25, 1990, Denver, Colo. IEEE Catalog #90CH2859-7, pp. 424–427.
Tsuchiya et al., "Electron Mobility in GaAs-AlAs Double Quantum Wells Having Resonant Coupling," Inst. Phys. Conf. Ser. No. 112: Chapter 6, paper presented at Int. Symp. GaAs and Related Compounds, Jersey, Channel Islands, Sep. 24–27, 1990, pp. 339–344.

*Primary Examiner*—Mark V. Prenty
*Attorney, Agent, or Firm*—Staas & Halsey

[57] ABSTRACT

A heterojunction semiconductor device comprises a semi-insulating substrate, a channel layer comprising first and second sub-layers provided on the substrate for sustaining a two-dimensional carrier gas therein, a carrier supplying layer of a doped semiconductor material provided on the channel layer, a source electrode a drain electrode and a gate electrode provided on the carrier supplying layer. The first and second sub-layers have respective first and second saturation drift velocities of carriers such that the first saturation drift velocity is substantially larger than said second saturation drift velocity.

10 Claims, 5 Drawing Sheets

SEMICONDUCTOR DEVICE HAVING A HETEROJUNCTION INTERFACE FOR TRANSPORTING CARRIERS WITH IMPROVED CARRIER MOBILITY

BACKGROUND OF THE INVENTION

The present invention generally relates to semiconductor devices and, more particularly, to a heterojunction semiconductor device such as a high electron mobility transistor (HEMT) that has a heterojunction interface for transporting carriers in the form of a two-dimensional carrier gas.

The high electron mobility transistor (HEMT) is a MOS transistor that uses a two-dimensional carrier gas formed at a heterojunction interface for the device operation. The device has a characteristically high operational speed associated with the high mobility of the carriers transported in the form of the two-dimensional carrier gas, and is used widely for various microwave applications. As usual in the MOS transistors, the operational speed of the HEMT increases when the gate length of the device is decreased. Thus, various intensive attempts, including improvement of the submicron fabrication processes, have been made to realize a device having a reduced gate length.

When the gate length of the device is decreased excessively, on the other hand, there arises a problem that the operation of the device is affected in such a way that it deviates from the characteristics that are predicted by the gradual approximation model. This effect is known as the short-channel effect. More specifically, the electric field formed in the channel region is no longer characterized by an electric flux directed parallel to the two-dimensional carrier gas. In addition, the effect of a component acting vertically to the plane of the two-dimensional carrier gas is no longer negligible. Under such a situation, the carrier, such as electrons, experience a force that acts perpendicular to the plane of the two-dimensional carrier gas and are urged in the downward direction toward the substrate. In addition, due to the acceleration occurring in the channel region, the energy of the two-dimensional carrier gas increases. When this occurs, the confinement of the carriers in the form of the two-dimensional carrier gas, caused by a potential barrier that characterizes the heterojunction interface, is no longer effective and the carriers tend to spread into the substrate by diffusion. Thereby, various problem occur, such as reduction of the operational speed, reduced transconductance, etc.

Figure 1A:
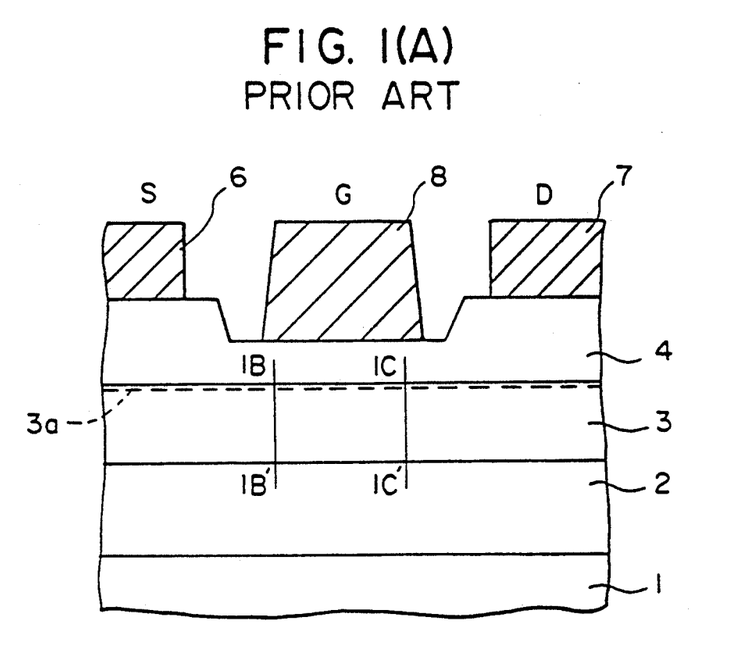
FIGS. 1(A)–1(C) are diagrams showing the structure and operation of a conventional HEMT.

FIG. 1(A) shows the structure of a typical conventional HEMT.

Referring to FIG. 1(A), the device includes a semi-insulating substrate 1 composed of a suitable single crystal compound semiconductor material such as GaAs, and a buffer layer 2 of the same composition which is grown on the substrate 1 epitaxially. On the buffer layer 2, a channel layer 3 of undoped semiconductor material such as GaAs, having a large electron affinity and simultaneously a small band gap, such as GaAs is provided epitaxially, and an electron supplying layer 4 of n-type semiconductor material, such as AlGaAs, having a smaller electron affinity and simultaneously a large band is provided on the channel layer 3 epitaxially. Further, source and drain electrodes 6 and 7, respectively are provided on the doped electron supplying layer 4 in ohmic contact therewith across a channel region, and a gate electrode 8 is provided on the upper major surface of the electron supplying layer 4 in correspondence to the channel region by establishing a Schottky contact therewith. As is the common practice, the thickness of the electron supplying layer 4 is adjusted in correspondence to the channel region such that the device has a desired threshold voltage $V_{TH}$.

As an alternative to the channel layer 3 formed of GaAs, one may use InGaAs that provides a still larger electron mobility for the channel layer 3. In this case, the thickness of the channel layer 3 has to be restricted to less than 15–25 nm to avoid the formation of dislocations in the InGaAs layer 3. Further, one may use InP for the substrate 1. In this case, the buffer layer 2 is formed of InAlAs while the channel layer 3 is formed of InGaAs. Further, the electron supplying layer 4 is formed of InAlAs.

In operation, a two-dimensional electron gas 3a is formed in the channel layer 3 along a heteroepitaxial interface between the layer 3 and the layer 4, and the source electrode 6 injects the electrons into the two-dimensional electron gas 3a via the electron supplying layer 4 while the drain electrode 7 collects the electrons from the two-dimensional electron gas 3a via the electron supplying layer 4. Thereby, the electrons flow from the source electrode 6 to the drain electrode 7 along the two-dimensional electron gas 3a under control of the electric voltage applied to the gate electrode 8. Because of reduced scattering of the electrons in the substantially dopant-free channel layer 3, the electrons are transported at a high speed along the two-dimensional electron gas, and the desired high speed operation of the device is obtained.

In such a device, a large acceleration of the electrons occurs under the channel region due to a large voltage difference between the drain electrode 7 and the gate electrode 8. This acceleration is enhanced particularly when the gate length is reduced as in the currently proposed devices, in which each gate length is about 0.25 $\mu$m. In the devices that use the InGaAs channel layer, use of an even smaller gate length of 0.15 $\mu$m has been proposed.

Figure 1B:
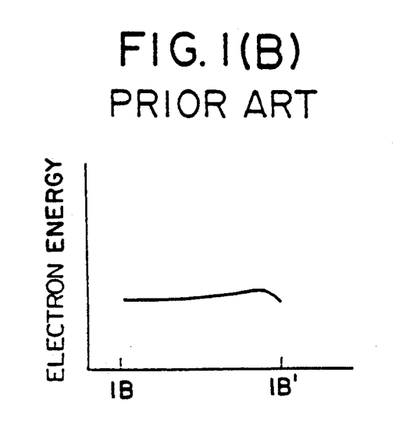
Figure 1C:
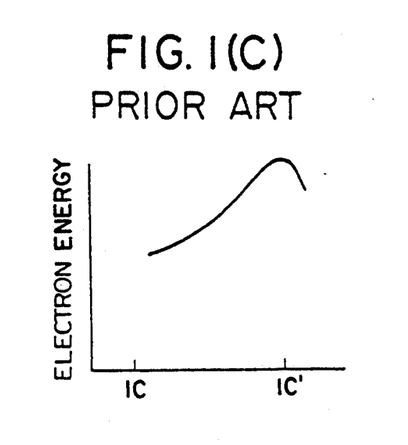

FIGS. 1(B) and 1(C) show, in respective cross sectional view, taken along the lines 1B-1B' and 1C-1C', the energy distribution of the electrons. As will be seen in these drawings, a substantial increase in the energy of the electrons across the channel region formed under the gate electrode 8 occurs. Particularly, it is clear from FIG. 1(C) that the acceleration of the electrons is significant at the lower part of the channel layer. It should be noted that such accelerated electrons form so-called hot electrons.

Figure 2:
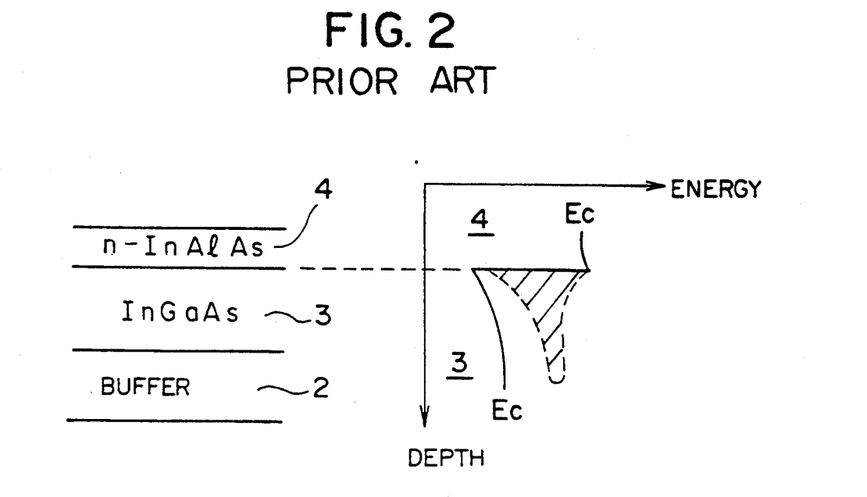
FIG. 2 is a diagram showing the structure and operation of another conventional HEMT.

FIG. 2 shows the energy spectrum of the two-dimensional electron gas formed at the heterojunction interface between the channel layer 3 of undoped InGaAS and the electron supplying layer 4 of n-type InAlAs, together with the conduction band Ec. As will be seen therein, the energy level of the two-dimensional electron gas increases as a result of the acceleration occurring under the gate electrode 8. In other words, the two-dimensional electron gas shifts to the higher energy side as a result of the acceleration of the electrons. As a result of the increase in the energy level, it will be noted that the confinement of the two-dimensional electron gas at the heterojunction interface by the potential well formed by the conduction band Ec of the layers 3 and 4 is decreased and the electrons tend to spread into the interior of the channel layer 3. Further, the electrons may diffuse into the buffer layer 2 or further into the substrate 1 located underneath the channel layer 3. It should be noted that the diffusion of the electrons into the underlying layer is facilitated by the vertical component of the electric flux that characterizes the short-channel effect. Thereby, the transconductance of the device inevitably deteriorates because of the decrease of the carrier density. Further, the response for controlling the flow of the carriers by the gate voltage applied to the gate electrode 8 deteriorates.

Figure 3:
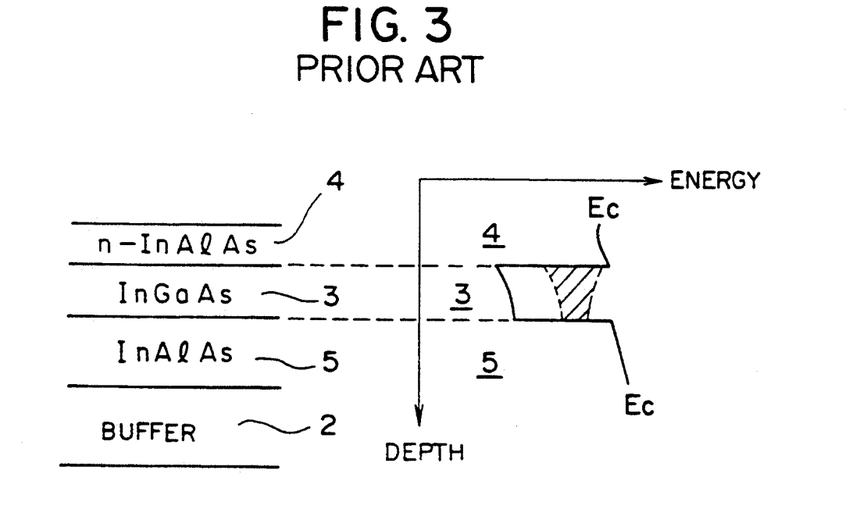
FIG. 3 is a diagram showing the structure and operation of still another conventional HEMT.

In order to eliminate the problem of the electrons escaping from the channel layer 3, a structure shown in FIG. 3 has been proposed, wherein a barrier layer 5 is interposed between the channel layer 3 and the buffer layer 2 to form a deep potential well in correspondence to the channel layer 3. The barrier layer 5 may be made of an undoped epitaxial layer having a composition identical with the composition of the layer 4 and forms a potential barrier with a barrier height substantially identical with the barrier height formed at the heterojunction interface between the layers 3 and 4. By constructing the device as above, one can eliminate the problem of the electrons or carriers escaping away from the channel layer 3.

In the device of FIG. 3, however, there exists a problem in that some of the carriers tend to penetrate into the layer 5 by the tunneling effect. When this occurs, the carriers tend to be trapped in the localized defect levels existing in the layer 5. The carriers thus trapped are then transported through the layer 5 by jumping from one defect to another at a speed which is much slower than in the channel layer 3. Thereby, a slow signal component appears in the output. of the HEMT and the operational characteristics of the device deteriorate.

The device of FIG. 3 has another problem in that the carrier velocity of the channel layer is relatively small. It should be noted that the materials such as GaAs or InGaAs, used for the channel layer 3, have a large carrier mobility so that rapid acceleration of the carriers is achieved in the channel region near the source electrode 7 where the strength of the electric field is weak. On the other hand, these materials show a saturation of the carrier velocity at a relatively small value. Thus, once the carriers enter the part of the channel region close to the drain electrode 8, the desired acceleration of carriers does not occur. Thus, the HEMT having the conventional structure has the disadvantage that it cannot obtain the desired or expected increase of the operational speed even when the gate length thereof is reduced.

SUMMARY OF THE INVENTION

Accordingly, it is a general object of the present invention to provide a novel and useful heterojunction semiconductor device, wherein the aforementioned problems are eliminated.

Another and more specific object of the present invention is to provide a heterojunction semiconductor device having a reduced gate length, wherein the problem of the carriers escaping away from the channel layer is effectively eliminated.

Another object of the present invention is to provide a heterojunction semiconductor device having a reduced gate length, wherein the carrier velocity is increased even more.

Another object of the present invention is to provide a heterojunction semiconductor device comprising a semi-insulating substrate having an upper major surface; a channel layer having upper and lower major surfaces and being provided on said upper major surface of said semi-insulating substrate for transporting carriers therethrough, said channel layer including a two-dimensional carrier gas formed therein along said upper major surface of said channel layer, said channel layer comprising an undoped first sublayer of a first semiconductor material having a lower major surface coincident to said lower major surface of said channel layer and an upper major surface, and an undoped second sub-layer of a second semiconductor material having an upper major surface coincident to said upper major surface of said channel layer and a lower major surface, said second sub-layer being provided on said first sub-layer, a carrier supplying layer of a doped third semiconductor material, said carrier supplying layer having upper and lower major surfaces and being provided on said upper major surface of said channel layer, source electrode means provided on said upper major surface of said carrier supplying layer in ohmic contact therewith, for injecting carriers into said two-dimensional carrier gas via said carrier supplying layer, drain electrode means provided on said upper major surface of said carrier supplying layer in ohmic contact therewith to be separated from said source electrode means, for recovering the carriers from said two-dimensional carrier gas via said carrier supplying layer; gate electrode means provided on said upper major surface of said carrier supplying layer between said source and drain electrode means for controlling a flow of the carriers through said two-dimensional carrier gas, said first and second sublayers having respective first and second saturation drift velocities of carriers such that said first saturation drift velocity is substantially larger than said second saturation drift velocity.

According to the present invention, the carriers are accelerated first in the second channel layer and then enter into the first channel layer that has a large saturation drift velocity. Thereby, the carriers are transported at a much higher speed than in the conventional HEMT that has only one channel layer. Preferably, a semiconductor material that exhibits a maximum carrier mobility is used for the second channel layer. Thereby, a large acceleration of carriers occurs in the second channel layer, once the carriers are injected from the carrier supplying layer into the second channel layer. The carriers thus accelerated then enter into the first channel layer and are transported therethrough at a high speed. Thereby, it is not necessary or essential that the first channel layer has a large carrier mobility. Thus, the device of the present invention exploits the hitherto disadvantageous effect of the carrier diffusion away from the channel layer, for the improvement of the device operation.

Other objects and further features of the present invention will become apparent from the following detailed description when read in conjunction with the attached drawings.

DETAILED DESCRIPTION OF THE PRESENT INVENTION

Figure 4:
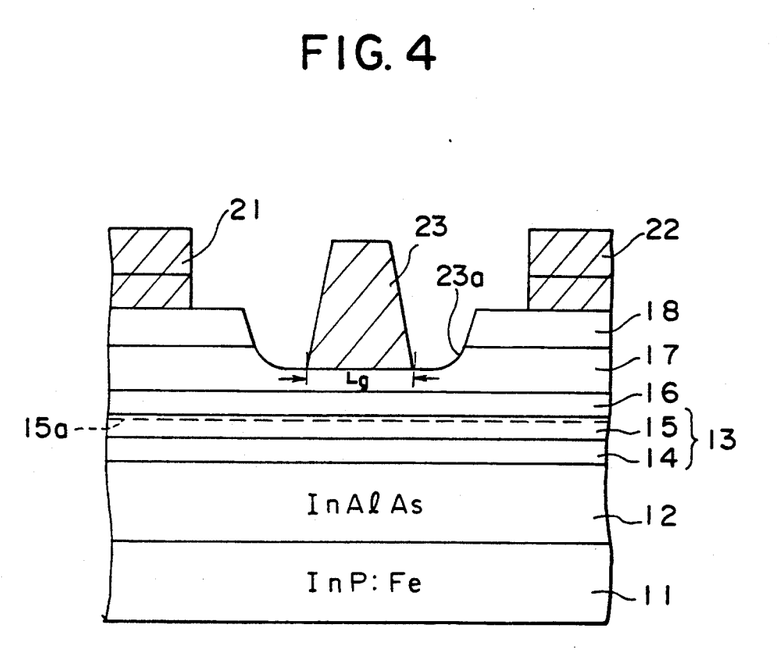
FIG. 4 is a diagram showing the structure of a HEMT according to the present invention.

FIG. 4 shows the structure of an HEMT according to an the present invention.

Referring to FIG. 4, the device is constructed on a semi-insulating substrate 11 of a single-crystal InP, which is made unconductive by Fe doping. The substrate 11 has a thickness of several hundred microns, and a buffer layer 12 of InAlAs is grown epitaxially with a thickness of about 400 nm on the substrate 11 such that the buffer layer 12 provides a substantially defect-free crystal surface. Further, a channel layer 14 of undoped InP is grown epitaxially on the buffer layer 12 with a thickness of about 15 nm, and another channel layer 15 of undoped InGaAs is grown epitaxially on the channel layer 14 with a thickness also of about 15 nm. Thereby, the layers 14 and 15 form a channel structure 13 for transporting carriers.

On the channel layer 15, a spacer layer 16 of undoped InAlAs is grown epitaxially with a thickness of typically about 2 nm, and an electron supplying layer 17 of n-type InAlAs is grown further on the spacer layer 16 epitaxially with a thickness of about 20 nm. Typically, the electron supplying layer 17 is doped by Si with an impurity concentration level of about $3 \times 10^{18}$ cm$^{-3}$. On the electron supplying layer 17, a contact layer 18 of n-type InGaAs, doped by Si with the impurity concentration level of about $3 \times 10^{18}$ cm$^{-3}$, is grown epitaxially with a thickness of about 20 nm.

In order to establish a lattice matching with the InP substrate, the composition of the InAlAs buffer layer 12 as well as the composition of the InAlAs electron supplying layer 17 are set to $In_{0.52}Al_{0.48}As$. It should be noted that these layers have a substantial thickness and hence require a strict control of composition in order to achieve the lattice matching with respect to the InP substrate 11. When the lattice matching is not established, the epitaxial growth is no longer possible. Further, defects such as dislocations may be introduced in the crystal layer even when the epitaxial growth is made successfully. Similarly, the channel layer 15 has a composition typically set to $In_{0.51}Ga_{0.49}As$ in order to meet the condition of the lattice matching. In the case, of the channel layer 15, however, the constraint of the lattice matching is not so strict as in the case of the buffer layer 12, as the thickness of the channel layer 15 is substantially smaller than the buffer layer 12. In fact it is preferable to increase the content of In slightly as compared with the foregoing lattice matching composition as will be discussed later. In this case, the composition of the layer 15 is represented as $In_{0.51+x}Ga_{0.49-x}As$.

On the upper major surface of the contact layer 16, ohmic electrodes 21 and 22 are provided as the source and drain electrodes. As usual, the electrodes 21 and 22 are formed by stacking Au and Au-Ge alloy layers consecutively, followed by an alloying process. On the other hand groove 23a is formed in the contact supplying layer 18 in correspondence to a channel region that extends between the electrode 21 and the electrode 22, and a Schottky electrode 23 is provided on the channel region thus formed as the gate electrode. The depth of the groove 23a is set in accordance with the desired threshold voltage of the device and may reach and extend into the electron supplying layer 17 as illustrated.

The general operation of the device of FIG. 4 is more or less identical with the operation of a conventional HEMT. Thus, there is formed a two-dimensional electron gas 15a in the channel layer 15 along the upper major surface of the layer 15 because of the electron affinity that is larger in the layer 15 than in the layer 16. Thereby, electrons are injected from the source electrode 21 into the channel layer 15 and move along the two-dimensional electron gas 15a upon biasing applied across the source and drain electrodes 21 and 22. As the channel layer 15 is free from the dopant, the electrons are transported without experiencing substantial scattering by the dopant atoms. Further, the spacer layer 16 eliminates the scattering of the electrons caused by the dopants contained in the electron supplying layer 17. Further, the electrons are recovered from the two-dimensional electron gas by the drain electrode 22. The flow of the electrons from the source electrode 21 to the drain electrode 22 is controlled by the gate voltage applied to the gate electrode 23.

On the other hand, the operation of the device of FIG. 4 is different from the conventional device such as the one shown in FIG. 1 in that the two-dimensional electron gas 15a, formed at the heterojunction interface between the layers 15 and 16 in the normal, unbiased state, is allowed to penetrate deeply into the channel layer 15 and ultimately reach the channel layer 14 underlying the channel layer 15 upon the acceleration of the electrons occurring in the channel region. The present invention thereby maximizes the operational speed of the device by using a material that exhibits a saturation drift velocity of carriers that is larger than the channel layer 15, for the layer 14.

Figure 5:
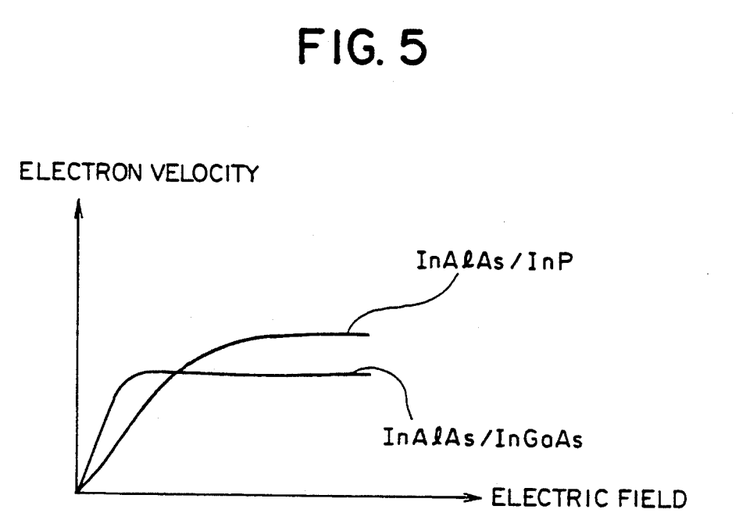
FIG. 5 is a diagram showing the relationship between the electron velocity and the electric field for various materials used in the device of FIG. 3.

FIG. 5 shows the relationship between the electric field E and the electron drift velocity V that is achieved in the two-dimensional electron gas under the presence of the electric field E, for the materials forming the channel layer 14 and the channel layer 15. More specifically, the curve designated in FIG. 5 as InAlAs/InGaAs represents the relationship for a HEMT that has an InAlAs/InGaAs heterojunction interface formed between an n-type InAlAs electron supplying layer and an InGaAs channel layer. This structure corresponds to the device of FIG. 1. On the other hand, the curve designated as InAlAs/InP represents the relationship for a HEMT that has an InAlAs/InP heterojunction interface formed between an n-type InAlAs electron supplying layer and an InP channel layer.

As will be seen from these curves, the acceleration of the electrons is greater in the former device that uses the InGaAs channel layer than in the latter device that uses the InP channel layer, particularly in the region wherein the magnitude of the electric field is small. This clearly reflects the situation that the electron mobility is larger in the InGaAs channel layer than in the InP channel layer. On the other hand, it will be seen that the electron drift velocity saturates at a relatively low level in the InGaAs channel layer as compared with the InP channel layer. Such a saturation of the electron drift velocity occurs for example as a result of the scattering of the electrons by thermally excited phonens and is considered pertinent to the material that forms the channel layer. Thus, one may think that the use of InP in place of InGaAs in the device of FIG. 1 may provide the desired improvement of operational speed of the device because of the larger saturation drift velocity. This argument, however, does not hold as the InP channel layer is characterized by a small electron mobility as shown in the smaller slope of the curve InAlAs/InP in correspondence to the region wherein the magnitude of the electric field is small. The device of FIG. 4 eliminates the foregoing problem by using two, different channel layers 14 and 15 stacked with each other.

Figure 6A:
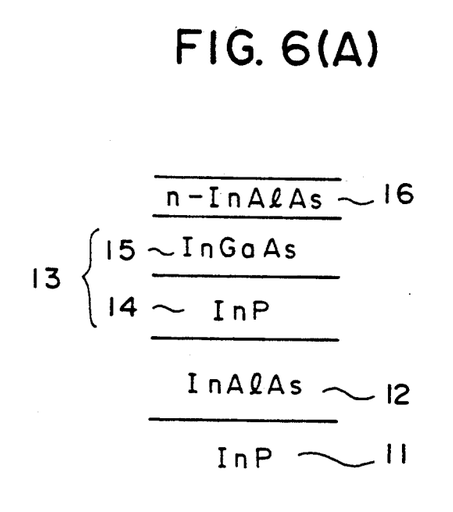
FIGS. 6(A) and 6(B) are diagrams showing the epitaxial structure as well as the corresponding band structure of the device of FIG. 4.
Figure 6B:
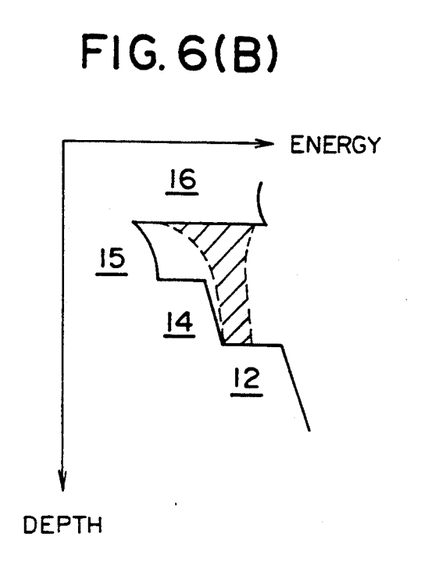

FIG. 6(A) shows the epitaxial structure of the device of FIG. 4 in detail, while FIG. 6(B) shows the band diagram pertinent to the structure of FIG. 6(A).

As can be seen in FIG. 6(B), a potential barier is formed between the conduction band of the buffer layer 12 and the channel layer 14, and another potential barrier is formed between the conduction band of the channel layer 14 and the channel layer 15, in addition to the usual potential barrier formed at the heterojunction interface between the layer 15 and the layer 16. It will be noted that InGaAs that forms the channel layer 15 has an electron affinity that is substantially larger than the electron affinity of the InAlAs that forms the spacer layer 16 or the buffer layer 12. In addition, InP that forms the channel layer 14 has an electron affinity that fills larger than InAlAs. Thereby, the layers 14 and 15 form a potential well that confines the two-dimensional electron gas therein. In addition, the electron affinity of InGaAs is larger than the electron affinity of InP. Thereby, there is formed another deep potential well within the foregoing potential well such that the second potential well is defined by potential walls coincident to the upper and lower major surfaces of the channel layer 15.

As already noted with reference to FIG. 2, the electrons forming the two-dimensional electron gas tend to penetrate deeply into the channel layer 15 as a result of the acceleration. It should be noted that this acceleration of electrons occurs efficiently in the channel layer 15 that exhibits a large electron mobility, particularly in the channel region that is close to the source electrode 21. With the acceleration, the electron gas overrides the potential wall of the deep, second potential well and starts to invade the underlying channel layer 14 as indicated in FIG. 6(B) by shading. Once the electrons enter into the channel layer 14, the electrons are transported with a higher saturation drift velocity than in the channel layer 15 and the operational speed of the device is maximized. This high speed transport of the electrons through the channel layer 14 occurs particularly in the part of the channel region that is close to the drain electrode. It should be noted that the conventional HEMT having the structure of FIG. 1 can not exploit the large electric field formed in the channel region close to the drain electrode for the acceleration of the electrons.

In the epitaxial structure of FIG. 6(A), it will be noted that the penetration of the electrons into the buffer layer 12 is effectively eliminated by the potential barrier formed between the buffer layer 12 and the channel layer 14.

It is known that the increase of the In content in the InGaAs causes an increase in the mobility of carriers therein. Thus one may increase the content of In in the channel layer 15 within the range that the channel layer maintains the substantially defect-free structure. For example, the composition of the channel layer 15 may be represented as $In_{0.51+x}Ga_{0.49-x}As$ with the compositional parameter x set to 0.2.

In the device of FIG. 4, the total thickness of the layers 14, 15, and 17 is determined in relation to the gate length of the device such that the total thickness is generally smaller than one half the gate length of the device. The thickness of the spacer layer 16 is not significant. For example, the thicknesses of the layers 14, 15 and 17 are set to satisfy the relationship $$L_g > t_{14} + t_{15} + t_{17}$$

wherein $t_{14}$ represents the thickness of the layer 14, $t_{15}$ represents the thickness of the layer 15, and $t_{17}$ represents the thickness of the layer 17 in correspondence to the channel region. The contribution of the layer 16 is neglibible as mentioned previously. Further, $L_g$ represents the gate length. It should be noted that the thickness $t_{17}$ is determined by the desired threshold voltage of the device.

Assuming the device has the gate length $L_g$ of about 1500 Å and the thickness $t_{17}$ of about 300 Å, it is concluded that the total thickness of the channel layers 14 and 15 is approximately equal to or smaller than about 450Å. In fact, the thickness of the layers 14 and 15 described previously with reference to FIG. 4 satisfies the foregoing relationship.

Next, the fabrication process of the device of FIG. 4 will be described briefly with reference to FIGS. 7(A)-7(E). As the process such as the deposition and patterning of electrodes after the epitaxial layers are formed is identical with the fabrication process of conventional HEMTs, only the epitaxial growth of the layers 14 and 15 on the buffer layer 12 will be described. In the present embodiment, the epitaxial growth is achieved by the MOCVD process.

Figure 7A:
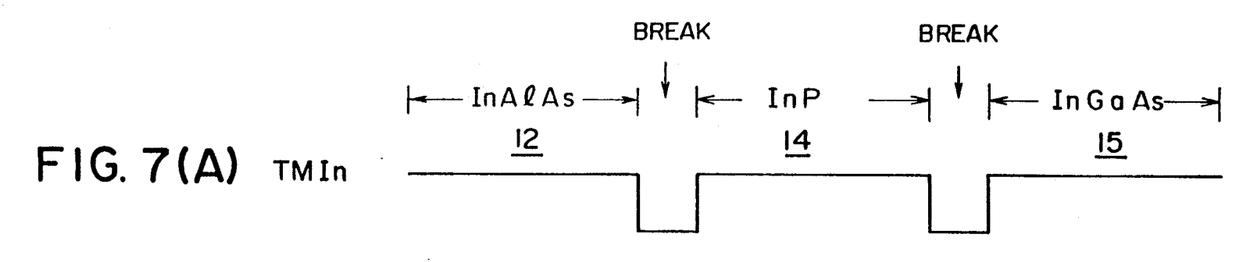
FIGS. 7(A)-7(E) are diagrams showing the process for fabricating the device of FIG. 4.
Figure 7B:
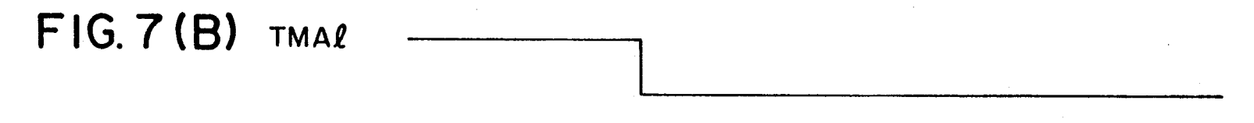
Figure 7C:
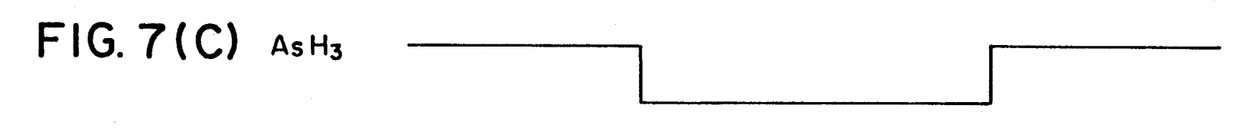

The buffer layer 12 is grown on the substrate 11 by flowing TMIn (tetramethyl indium), TMA1 (tetramethyl aluminum) and arsine (ASH3) as shown in FIGS. 7(A), 7(B) and 7(C), while holding the substrate 11 at a temperature of about 650° C.

Figure 7D:
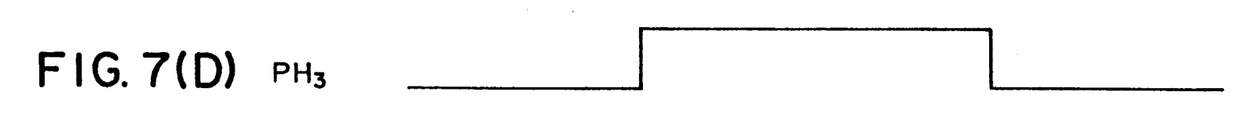
Figure 7E:
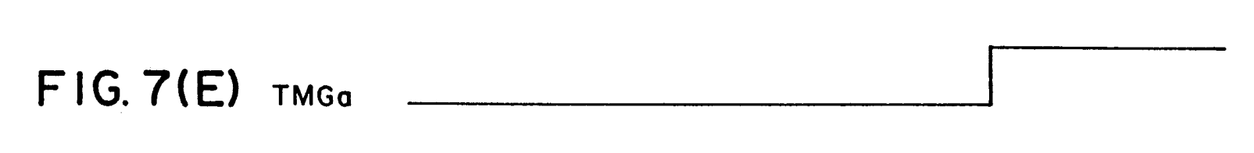

After the buffer layer 12 is grown to the thickness of about 400 nm, the supply of TMIn, TMAl and arsine is interrupted. Simultaneously to the interruption, the supply of phosphine (PH3) is started as shown in FIG. 7(D). In this state, the reaction vessel is flushed for about 2 seconds until the source gas for the group V element is completely exchanged. During this flushing process, the supply of the group III element and hence the growth of the epitaxial layer is interrupted as shown in FIG. 7(A). It should be noted that As has a tendency to be incorporated into InP preferentially and has to be purged completely before the growth of InP is started.

After the flushing is completed, the supply of TMIn is resumed as shown in FIG. 7(A) and the InP channel layer 14 is grown on the buffer layer 12 with the thickness of about 15 nm. During this process, the supply of phosphine is continued as shown in FIG. 7(D) while the supply of other source gases is interrupted.

After the channel layer 14 is grown, the supply of TMIn is interrupted first, as shown in FIG. 7(A). In this state, the growth of the InP channel layer 14 is interrupted. On the other hand, the supply of phosphine is continued after the break of the epitaxial growth as shown in FIG. 7(D) to prevent evaporation of phosphorus from the InP channel layer 14 thus deposited.

Simultaneously with the interruption of the supply of phosphine, the supply of arsine is started as shown in FIG. 7(C), and the supply of TMIn is resumed after about 2 seconds from the interruption of the epitaxial process. Further the supply of TMGa (trimethyl gallium) is started simultaneously with the restarting of the supply of TMIn and arsine. Thereby, the InGaAs channel layer 15 is grown on the InP channel layer 14. It should be noted that contamination of InGaAs layer 15 by P is generally negligible because of the tendency of expelling P from the epitaxial layer.

Further, the present invention is not limited to the embodiments described heretofore, but various variations and modifications may be made without departing from the scope of the invention.

What is claimed is:

1. A heterojunction semiconductor device comprising:
    a semi-insulating substrate having an uppermost surface;
    a channel layer, having upper and lower major surfaces and formed on said upper major surface of said semi-insulating substrate, receiving and transporting carriers therethrough, said channel layer including a two-dimensional carrier gas formed therein along said upper major surface of said channel layer and comprising:
        an undoped first sub-layer of a first semiconductor material having a lower major surface coincident with said lower major surface of said channel layer and an upper major surface, and
        an undoped second sub-layer of a first semiconductor material having a lower major surface coincident with said lower major surface of said channel layer and an upper major surface, and
        an undoped second sub-layer of a second semiconductor material having an upper major surface coincident with said upper major surface of said channel layer and a lower major surface formed on said upper major surface of said first sub-layer;
    a carrier supplying layer, of a doped third semiconductor material, having upper and lower major surfaces and formed with said lower major surface thereof on said upper major surface of said channel layer, said carrier supplying layer generating said carriers;
    a source electrode, formed on and in ohmic contact with said upper major surface of said carrier supplying layer, injecting said carriers into said two-dimensional carrier gas from said carrier supplying layer;
    a drain electrode, formed on and in ohmic contact with said upper major surface of said carrier supplying layer and spaced apart from said source electrode, recovering said carriers from said two-dimensional carrier gas via said carrier supplying layer;
    a gate electrode, formed on said upper major surface of said carrier supplying layer and between said source and drain electrodes, controlling a flow of said carriers through said two-dimensional carrier gas;
    said first and second sub-layers having first and second saturation drift velocities of said carriers, respectively, said first saturation drift velocity being substantially lager than said second saturated drift velocity; and
    said carriers flowing through said two-dimensional carrier gas and being transported through said second sub-layer in a relatively lower energy state of said carriers, a number of said carriers in said two-dimensional carrier gas being transported through said first sublayer upon acceleration of said number of carriers to a relatively higher energy state higher than said relatively lower energy state.

2. The heterojunction semiconductor device as claimed in claim 1, wherein said first and second sub-layers have first and second electron mobilities, respectively, said second electron mobility being larger than said first electron mobility.

3. The heterojunction semiconductor device as claimed in claim 1, wherein said first and second sub-layers have first and second electron affinities, respectively, such that said second sub-layer forms a first potential well, defined by a first potential barrier in coincidence with said upper major surface of said second sub-layer, and a second, opposing potential barier in coincidence with said lower major surface of said second sub-layer, said first and second potential barriers having first and second barier heights, respectively, wherein said first barrier height is substantially larger than said second barrier height.

4. The heterojunction semiconductor device as claimed in claim 3, wherein said first sub-layer forms a second potential well defined by a third potential barrier in coincidence with said lower major source of said first sub-layer.

5. The heterojunction semiconductor device as claimed in claim 1, wherein said first sub-layer comprises InP and said second sub-layer comprises InGaAs.

6. The heterojunction semiconductor device as claimed in claim 5, wherein said second sub-layer has a composition of $In_{0.51}Ga_{0.49}As$.

7. The heterojunction semiconductor device as claimed in claim 1, wherein said upper major surface of said first sub-layer is in intimate contact with said lower major surface of said second sub-layer.

8. A heterojunction semiconductor device, comprising:
    a semi-insulating substrate having an upper major surface;
    a channel layer, having upper ran slower major surfaces and formed on said upper major surface of said semi-insulting substrte, receiving and transporting carriers therethrough, said channel layer including a two-dimensional carrier gas formed therein along said upper major surface of said channel layer and comprising:
        an undoped first sub-layer of a first semiconductor material having a lower major surface coincident with said lower major surface of said channel layer and an upper major surface, and
        an undoped second sub-layer of a second semiconductor material having an upper major surface coincident with said upper major surface of said channel layer and a lower major surface formed on said upper major surface of said first sub-layer;
    a carrier supplying layer, of a doped third semiconductor material, having upper and lower major surfaces and formed with said lower major surface thereof on said upper major surface of said channel layer, said carrier supplying layer generating said carriers;

a source electrode, formed on and in ohmic contact with said upper major surface of said carrier supplying layer, injecting said carriers into said tow-dimensional carrier gas from said carrier supplying layer;

a drain electrode, formed on and in ohmic contact with said upper major surface of said carrier supplying layer and spaced apart from said source electrode, recovering said carrier from said two-dimensional carrier gas via said carrier supplying layer;

a gate electrode, formed on said upper major surface of said carrier supplying layer and between said source and drain electrodes, controlling a flow of said carriers through said two-dimensional carrier gas;

said first and second sub-layers having first and second saturation drift velocities of said carriers, respectively, said first saturation drift velocity being substantially larger than said second saturation drift velocity; and a buffer layer, having upper and lower major surfaces and interposed between said upper major surface of said semi-insulating substrate and said lower major surface of said channel layer, forming an improved crystal such at said uppermajor surface thereof, said buffer layer comprising an undoped semiconductor material having a composition identical to said third semiconductor material forming said carrier supplying layer.

9. The heterojunction semiconductor device as claimed in claim 1, wherein:
said gate electrode has a gate length; and
a total thickness of said first sub-layer, said second sub-layer and said carrier supplying layer is less than one-half said gate length.

10. A therojunction semiconductor device having a source electrode, a drain electrode, a are electrode and a carrier supplying layer with a lower major surface and an upper major surface and creating a supply of carriers, said heterojunction semiconductor device comprising:

a semi-insulating substrate having an upper major surface;

a buffer layer having an upper major surface and a lower major surface and formed with said lower major surface thereof on said upper major surface of said semi-insulating substrate, said buffer layer having a firs electron affinity;

a channel layer receiving the carriers from the carrier supplying layer, said channel layer comprising:
a first sub-layer having an upper major surface and a lower major surface and formed with said lower major surface thereof on said upper major surface of said buffer layer, said first sub-layer having a second electron affinity higher than said first electron affinity, a second sub-layer having an upper major surface and a lower major surface and formed with said lower major surface thereof on said upper major surface of said first sub-layer, said second sub-layer having a third electron affinity higher than said second electron affinity, sand a two-dimensional carrier gas formed along said upper major surface of said second sub-layer and receiving the carriers from the carrier supplying layer and transporting the carriers therethrough;

a spacer layer having an upper major surface and a lower major surface and formed with said lower major surface thereof on said two-dimensional carrier gas and said upper major surface in contact with the lower major surface of the carrier supplying layer, said spacer layer having a fourth electron affinity less than said second and third electron affinities and reducing scattering of the carries caused by the carrier supplying layer;

a contact layer having an upper major surface, a lower major surface and a groove extending from said upper major surface to said lower major surface thereof and formed with said lower major surface thereof on said upper major surface of said carrier supplying layer;

said source electrode being formed on and in ohmic contact with said upper major surface of said contact layer, causing the carriers to flow from said carrier supplying layer to said two-dimensional carrier gas;

said drain electrode being formed on and in ohmic contact with said upper major surface of said contact layer and spaced apart from said source electrode, causing the carriers to flow from said two-dimensional carrier gas to said drain electrode through said carrier supplying layer;

said gate electrode being located in said groove and formed on said supper major surface of said carrier supplying layer, controlling the flow of the carries through said two-dimensional carrier gas;

said second sub-layer having a first saturation drift velocity and transporting the carriers when the carriers are in a relatively lower energy state; and said first sub-layer having a second saturation drift velocity, higher than said first saturation drift velocity, and transporting the carries when accelerated to a relatively higher energy state higher than said relatively lower energy state.

* * * * *

UNITED STATES PATENT AND TRADEMARK OFFICE
CERTIFICATE OF CORRECTION

PATENT NO. : 5,326,995

DATED : July 5, 1994

INVENTOR(S) : Tatsuya OHORI

Page 1 of 2

It is certified that error appears in the above-indentified patent and that said Letters Patent is hereby corrected as shown below:

On the title page, item [57]:
       line 6, after "electrode" insert --,--.

Column 1    line 49, change "problem" to --problems--;

line 58, after "material" insert --,--;

line 60, delete "such as GaAs";

line 64, after "band" insert --gap--;

line 66, after "tively" insert --,--.

Column 2,   line 44, change "view" to --views--.

Column 5,   line 15, delete "an";

line 54, delete ",";

line 68, after "hand" insert --,--; delete "supply".

Column 6,   line 1, delete "ing".

Column 7,   line 1, change "phonens" to --phonons--;

line 29, change "fills" to --is--.

Column 8,   line 19, change "neglibible to --negligible change "L9" to --Lg--;

line 41, change "(ASH3)" to --(AsH$_3$)--.

Column 9,   lines 32 through 35 should be deleted.

UNITED STATES PATENT AND TRADEMARK OFFICE
CERTIFICATE OF CORRECTION

PATENT NO. : 5,326,995
DATED : July 5, 1994
INVENTOR(S) : Tatsuya OHORI

It is certified that error appears in the above-indentified patent and that said Letters Patent is hereby corrected as shown below:

Column 11,  line 3, change "tow-" to --two- --;

line 26, change "such" to --surface--;

line 38, change "are" to --gate--;

Column 12, line 10, change "sand" to --and--;

line 22, change "carries" to --carrier--;

line 42, change "supper" to --upper--;

line 43, change "carries" to --carrier--.

Signed and Sealed this

Twenty-fifth Day of October, 1994

Attest:

BRUCE LEHMAN

Attesting Officer

Commissioner of Patents and Trademarks